United States Patent [19]
Sato et al.

[11] Patent Number: 5,928,837
[45] Date of Patent: Jul. 27, 1999

[54] NEGATIVE-WORKING CHEMICAL-SENSITIZATION PHOTORESIST COMPOSITION COMPRISING OXIME SULFONATE COMPOUNDS

[75] Inventors: Mitsuru Sato, Hillsboro, Oreg.; Kiyoshi Ishikawa, Kanagawa-Ken, Japan; Yoshiki Sugeta, Yokohama, Japan; Hiroyuki Yamazaki, Kanagawa-Ken, Japan; Toshikazu Tachikawa, Yokohama, Japan; Hiroshi Komano, Kanagawa-Ken, Japan

[73] Assignee: Tokyo Ohka Kogyo Co., Ltd., Japan

[21] Appl. No.: 08/987,023

[22] Filed: Dec. 9, 1997

[30] Foreign Application Priority Data

Dec. 10, 1996 [JP] Japan ................................. 8-329785

[51] Int. Cl.$^6$ .................................................. G03C 1/492
[52] U.S. Cl. ........................ 430/270.1; 430/919; 430/921
[58] Field of Search ................................. 430/270.1, 919, 430/921

[56] References Cited

U.S. PATENT DOCUMENTS

| | | | |
|---|---|---|---|
| 4,371,605 | 2/1983 | Renner | 430/280 |
| 4,736,055 | 4/1988 | Dietliker et al. | 560/13 |
| 5,164,278 | 11/1992 | Brunsvold et al. | 430/176 |
| 5,237,059 | 8/1993 | Wakamatsu et al. | 540/355 |
| 5,627,011 | 5/1997 | Münzel et al. | 430/270.1 |
| 5,650,262 | 7/1997 | Munzel et al. | 430/270.1 |
| 5,714,625 | 2/1998 | Hada et al. | 558/437 |
| 5,759,740 | 6/1998 | Munzel et al. | 430/270.1 |

FOREIGN PATENT DOCUMENTS

| | | |
|---|---|---|
| 2104247 | 3/1994 | Canada . |
| 0 361 907 | 4/1990 | European Pat. Off. . |
| 0 571 330 | 11/1993 | European Pat. Off. . |
| 0 599 779 | 6/1994 | European Pat. Off. . |
| 0 780 729 | 6/1997 | European Pat. Off. . |
| 6-43647 | 2/1994 | Japan . |

*Primary Examiner*—Janet Baxter
*Assistant Examiner*—Rosemary Ashton
*Attorney, Agent, or Firm*—Wenderoth, Lind & Ponack, L.L.P.

[57] ABSTRACT

Proposed is a novel negative-working chemical-sensitization photoresist composition used in the photolithographic patterning work for the manufacture of semiconductor devices and the like and capable of giving a patterned resist layer with high sensitivity and pattern resolution as well as excellent heat resistance and excellently orthogonal cross sectional profile of the patterned resist layer. The composition comprises, as a uniform solution:

(A) 100 parts by weight of an alkali-soluble resin which is a polyhydroxystyrene-based resin having a weight-average molecular weight of at least 2000;

(B) from 3 to 70 parts by weight of an acid-crosslinkable compound which is an amino resin having hydroxyalkyl and/or alkoxyalkyl groups;

(C) from 0.5 to 30 parts by weight of a radiation-sensitive acid-generating compound selected from several types of specific oximesulfonate compounds; and (D) from 0.5 to 10 parts by weight of a phenolic compound, such as benzophenone compounds, having at least four hydroxyl groups in a molecule and a molecular weight smaller than 2000.

10 Claims, No Drawings

NEGATIVE-WORKING CHEMICAL-SENSITIZATION PHOTORESIST COMPOSITION COMPRISING OXIME SULFONATE COMPOUNDS

BACKGROUND OF THE INVENTION

The present invention relates to a novel negative-working chemical-sensitization photoresist composition or, more particularly, to a negative-working chemical-sensitization photoresist composition capable of giving, with high photosensitivity, a patterned resist layer having excellent pattern resolution and heat resistance and having an excellently orthogonal cross sectional profile.

It is a remarkable trend in recent years that the photolithographic patterning process in the manufacture of semiconductor devices and liquid crystal display panels is conducted by using a chemical-sensitization photoresist composition, which is a photoresist composition of the type utilizing the catalytic activity of an acid generated in the resist layer from a radiation-sensitive acid-generating compound when the resist layer is pattern-wise exposed to actinic rays so that patterning of a photoresist layer can be accomplished with high photosensitivity and excellent pattern resolution in a high efficiency even when the exposure dose is relatively small.

Chemical-sensitization photoresist compositions are classified into positive-working and negative-working photoresist compositions as is reported in Japanese Patent Kokai 2-154266, 6-43647, 6-67433 and elsewhere, of which the negative-working photoresist compositions, which form a patterned resist layer in the areas pattern-wise exposed to actinic rays by crosslinking, are preferred when the patterned resist layer is desired to have high heat resistance. However, negative-working chemical-sensitization photoresist compositions are not quite satisfactory in all respects because, when a novolak resin is used as the resinous ingredient, high pattern resolution and heat resistance cannot be obtained and, when the acid-generating agent used is a compound which releases hydrogen halide as the photoacid, the cross sectional profile of the patterned resist layer cannot be excellently orthogonal.

Accordingly, proposals have been made in Japanese Patent Kokai 6-236024 as a remedy of the above mentioned defects, according to which the heat resistance and pattern resolution can be improved by the use of a polyhydroxystyrene resin in place of a novolak resin. An improvement in the cross sectional profile of the patterned resist layer can be accomplished by the use of sulfonium compound as the photoacid-generating agent. The improvement obtained by these methods is still insufficient because the cross sectional profile of the patterned resist layer is sometimes upwardly narrowing trapezoidal form with rounded shoulders to be far from most desirable orthogonality.

SUMMARY OF THE INVENTION

The present invention accordingly has an object, in view of the above described problems and disadvantages in the conventional chemical-sensitization photoresist compositions in general, to provide a novel and improved negative-working chemical-sensitization photoresist composition of high photosensitivity capable of giving a patterned resist layer having excellent pattern resolution and heat resistance as well as excellently orthogonal cross sectional profile of the patterned resist layer without upwardly narrowing.

Thus, the negative-working chemical-sensitization photoresist composition provided by the present invention comprises, as a uniform solution in an organic solvent:

(A) 100 parts by weight of an alkali-soluble polyhydroxystyrene resin having a weight-average molecular weight of at least 2000;

(B) from 3 to 70 parts by weight of an acid-crosslinkable compound;

(C) from 0.5 to 30 parts by weight of a radiation-sensitive acid-generating compound selected from the group consisting of (C1) the compounds represented by the general formula $$R^1-C(CN)=N-O-SO_2-R^2, \qquad (I)$$

in which $R^1$ and $R^2$ are each a non-aromatic group, (C2) the compounds represented by the general formula $$R^3-C(CN)=N-O-SO_2-R^4, \qquad (II)$$

in which $R^3$ is an aromatic group and $R^4$ is a halogen-substituted or unsubstituted alkyl group having 1 to 4 carbon atoms, (C3) the compounds represented by the general formula $$A[-C(CN)=N-O-SO_2-R^5]_n, \qquad (III)$$

in which the subscript n is 2 or 3, A is a divalent, when n is 2, or tervalent, when n is 3, organic group and each $R^5$ is an unsubstituted or substituted monovalent hydrocarbon group, (C4) the compounds represented by the general formula $$R^6-C(CN)=N-O-SO_2-R^7, \qquad (IV)$$

in which $R^6$ is an aromatic group and $R^7$ is a monovalent group selected from the group consisting of aromatic polycyclic hydrocarbon groups and saturated or unsaturated non-aromatic polycyclic hydrocarbon groups, and (C5) the compounds represented by the general formula (V)

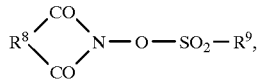

in which $R^8$ is an unsubstituted or substituted divalent saturated hydrocarbon group, unsaturated hydrocarbon group or aromatic group and $R^9$ is an unsubstituted or substituted monovalent saturated hydrocarbon group, unsaturated hydrocarbon group or aromatic group; and (D) from 0.5 to 10 parts by weight of a phenolic compound or, in particular, benzophenone compound having at least four hydroxyl groups in a molecule and a molecular weight smaller than 2000.

DETAILED DESCRIPTION OF THE PREFERRED EMBODIMENTS

The component (A) in the above defined negative-working chemical-sensitization photoresist composition is an alkali-soluble polyhydroxystyrene resin which is a (co)polymer having a main chain consisting of repeating monomeric units including hydroxystyrene units and/or α-methylhydroxystyrene units, optionally, in combination with other types of monomeric units provided that the copolymer is soluble in an aqueous alkaline solution. Examples of suitable copolymers include copolymers of hydroxystyrene and a styrene monomer other than hydroxystyrenes, (meth)acrylic acid or a derivative thereof, maleic anhydride and vinyl acetate.

The above mentioned non-hydroxyl styrene monomer is exemplified by styrene, α-methylstyrene, p- and o-methylstyrenes, p-methoxystyrene and p-chlorostyrene. The above mentioned derivative of (meth)acrylic acid is exemplified by methyl (meth)acrylate, ethyl (meth)acrylate, 2-hydroxyethyl (meth)acrylate, 2-hydroxypropyl (meth)-acrylate, (meth)acrylamide and (meth)acrylonitrile.

When the component (A) is a copolymer of a hydroxystyrene monomer and one or more of the above mentioned comonomers, it is optional that the hydroxyl groups and the carboxyl groups pendent to the comonomeric units are substituted or protected by protective groups such as alkoxycarbonyl groups, e.g., tert-butoxycarbonyl and tert-amyloxycarbonyl groups, tert-alkyl groups, e.g., tert-butyl groups, alkoxyalkyl groups, e.g., ethoxyethyl and methoxypropyl groups, and acetal groups, e.g., tetrahydro-pyranyl and tetrahydrofuranyl groups.

Among the above described various copolymers, particularly preferable in respect of rapidness of dissolution in an aqueous alkaline solution and good controllability of photosensitivity are those containing structural units capable of reducing the solubility of the resin in an aqueous alkaline solution, referred to as the solubility-reducing units hereinafter. Examples of the monomers capable of giving such a solubility-reducing unit include above mentioned styrene monomers and those monomers giving monomeric units of which the pendant hydroxyl groups are protected by specific groups. The copolymerization ratio of such a comonomer should be selected usually depending on the speed of the development treatment desired for the negative-working photoresist composition according to the invention. For example, it is preferable that the molar ratio of the monomeric units derived from the hydroxystyrene monomer and the monomeric units derived from a comonomer having a solubility-reducing structure is in the range from 70:30 to 95:5 or, preferably, from 75:25 to 90:10. When the proportion of the solubility-reducing units is too large, a decrease is caused in the solubility of the resist layer on the unexposed areas in the alkali-development treatment along with a decrease in the miscibility with the photoresist solution while, when the proportion thereof is too small, a decrease is caused in the film thickness retention in the exposed areas or photocured areas of the resist layer along with occurrence of a phenomenon of bridging between the resist patterns after development called the phenomenon of "microbridging".

When the photoresist layer to be formed from the inventive photoresist composition has a relatively large thickness of, for example, 3.0 μm or larger, it is preferable that the component (A) of the inventive photoresist composition is a combination of a homopolymer of a hydroxystyrene monomer such as hydroxystyrene and α-hydroxystyrene and one of the above described specific copolymers. When the above mentioned copolymer has much lower solubility in an aqueous alkaline solution than the homopolymer, however, a decrease is caused in the homogeneity of the resinous ingredient as the component (A) resulting in poor developability of the resist layer. In this regard, the molar ratio of the hydroxystyrene-based units and the solubility-reducing units in the copolymer is in the range, preferably, from 75:25 to 95:5 or, more preferably, from 80:20 to 90:10.

Though dependent on the particularly intended application of the photoresist composition, the blending ratio of the above mentioned homopolymer and the copolymer should be in the range from 1:99 to 99:1 or, preferably, from 30:70 to 70:30 or, more preferably, from 45:55 to 55:45.

It is essential in the inventive photoresist composition that the polyhydroxystyrene-based alkali-soluble resin as the component (A) has a weight-average molecular weight Mw, which can be determined by the gel permeation chromatographic method, of at least 2000 or, preferably, in the range from 2000 to 20000 or, more preferably, in the range from 2200 to 10000. When this value is too large, a decrease is caused in the solubility of the resin in an organic solvent. Further, it is desirable that the resin as the component (A) has a dispersion of the molecular weight distribution, i.e. the ratio of the weight-average molecular weight Mw to the number-average molecular weight Mn, as small as possible. Resins suitable as the component (A) should have a Mw:Mn ratio not exceeding 3.5 or, preferably, not exceeding 2.5 or, more preferably, not exceeding 1.5.

The component (B) in the inventive photoresist composition is an acid-crosslinkable compound which is not particularly limitative and can be selected from the acid-crosslinkable compounds conventionally used in negative-working chemical-sensitization photoresist compositions in the prior art. Examples of the acid-crosslinkable compound suitable as the component (B) include amino resins, such as melamine resins, urea resins, guanamine resins, acetoguanamine resins, benzoguanamine resins, glycoluryl-formaldehyde resins, succinylamide-formaldehyde resins and ethyleneurea-formaldehyde resins, having hydroxyl and/or alkoxy groups. Such hydroxyl and/or alkoxy group-containing amino resins can be obtained by the reaction of melamine, urea, guanamine, acetoguanamine, benzoguanamine, glycoluryl, succinylamide or ethyleneurea with formaldehyde in boiling water to effect methylolation, optionally, followed by the reaction with a lower alcohol to effect alkoxylation of the methylol groups. Various grades of such a resin product, which can be used as such as the component (B), are available on the market including melamine resin products Nicalacs MX-750, MW-30 and MW-100M and urea resin products such as Nicalac MX-290 (each a product by Sanwa Chemical Co.) as well as benzoguanamine resin products such as Cymels 1123 and 1128 (each a product by Mitsui Cyanamide Co.).

Besides the above described resinous compounds, several other compounds can be used as the component (B) including benzene compounds having alkoxy groups such as 1,3,5-tris(methoxymethoxy) benzene, 1,2,4-tris (isopropoxymethoxy) benzene and 1,4-bis(sec-butoxymethoxy) benzene and phenol compounds having non-phenolic hydroxyl or alkoxy groups such as 2,6-dihydroxymethyl-p-tert-butyl phenol.

The above described acid-crosslinkable compounds as the component (B) can be used either singly or as a combination of two kinds or more according to need although melamine resins, urea resins and benzoguanamine resins as well as combinations thereof are preferred.

The amount of the acid-crosslinkable compound as the component (B) in the inventive photoresist composition is in the range from 3 to 70 parts by weight or, preferably, from 5 to 50 parts by weight per 100 parts by weight of the alkali-soluble hydroxystyrene-based resin as the component (A). When the amount of the component (B) is too small, an undue decrease is caused in the photosensitivity of the photoresist composition while, when the amount thereof is too large, uniformity of the photoresist layer formed on the substrate surface is decreased along with a decrease in the developability so that patterned resist layers of good quality can hardly be obtained.

The component (C) in the inventive photoresist composition is a radiation-sensitive acid-generating compound which is a compound capable of being photochemically decomposed to release an acid when irradiated with actinic rays. Suitable acid-generating compounds in the inventive photoresist composition include the compounds represented by either one of the general formulas

  (I)

in which $R^1$ and $R^2$ are each a non-aromatic group,

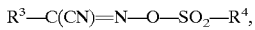  (II)

in which $R^3$ is an aromatic group and $R^4$ is a halogen-substituted or unsubstituted alkyl group having 1 to 4 carbon atoms,

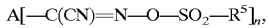  (III)

in which the subscript n is 2 or 3, A is a divalent, when n is 2, or tervalent, when n is 3, organic group and each $R^5$ is an unsubstituted or substituted monovalent hydrocarbon group,

  (IV)

in which $R^6$ is an aromatic group and $R^7$ is a monovalent group selected from the group consisting of aromatic polycyclic hydrocarbon groups and saturated or unsaturated non-aromatic polycyclic hydrocarbon groups, and

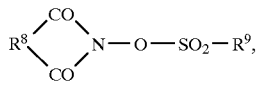  (V)

in which $R^8$ is an unsubstituted or substituted divalent saturated hydrocarbon group, unsaturated hydrocarbon group or aromatic group and $R^9$ is an unsubstituted or substituted monovalent saturated hydrocarbon group, unsaturated hydrocarbon group or aromatic group.

The non-aromatic group denoted by $R^1$ or $R^2$ in the above given general formula (I) includes alkyl, halogenoalkyl, alkenyl, cycloalkyl, cycloalkenyl, alkoxy, cycloalkoxy and adamantyl groups. The alkyl group can be a straightly linear or branched alkyl group having, preferably, 1 to 12 carbon atoms such as methyl, ethyl, n-propyl, isopropyl, n-butyl, isobutyl, sec-butyl, tert-butyl, n-pentyl, n-octyl and n-dodecyl groups. The halogenoalkyl group can be a monohalogeno- or polyhalogenoalkyl group of which the halogen can be any of fluorine, chlorine, bromine and iodine. The halogenoalkyl group has, preferably, 1 to 4 carbon atoms as exemplified by chloromethyl, trichloro-methyl, trifluoromethyl and 2-bromopropyl groups.

The alkenyl group can be straightly linear or branched and, preferably, has 2 to 6 carbon atoms as exemplified by vinyl, 1-propenyl, isopropenyl and 2-butenyl groups. The cycloalkyl group, preferably, has 5 to 12 carbon atoms as exemplified by cyclopentyl, cyclohexyl, cyclooctyl and cyclododecyl groups. The cycloalkenyl group, preferably, has 4 to 8 carbon atoms as exemplified by 1-cyclobutenyl, 1-cyclopentenyl, 1-cyclohexenyl, 1-cycloheptenyl and 1-cyclooctenyl groups. The alkoxy group, preferably, has 1 to 8 carbon atoms as exemplified by methoxy, ethoxy, propoxy, butoxy and pentoxy groups. The cycloalkoxy group, preferably, has 5 to 8 carbon atoms as exemplified by cyclopentoxy and cyclohexyloxy groups. It is particularly preferable that the group denoted by $R^1$ is selected from alkyl, cycloalkyl and cycloalkenyl groups or, more preferably, from cycloalkenyl groups while the group denoted by $R^2$ is selected, preferably, from alkyl, halogenoalkyl and cycloalkyl groups or, more preferably, from alkyl groups. Most preferably, $R^1$ is a cyclopentenyl group and $R^2$ is an alkyl group having 1 to 4 carbon atoms.

Examples of the oximesulfonate compound represented by the general formula (I) include: α-(methylsulfonyloxyimino)-1-cyclopentenyl acetonitrile, α-(methylsulfonyloxyimino)-1-cyclohexenyl acetonitrile, α-(methylsulfonyloxyimino)-1-cycloheptenyl acetonitrile, α-(methylsulfonyloxyimino)-1-cyclooctenyl acetonitrile, α-(trifluoromethylsulfonyloxyimino)-1-cyclopentenyl acetonitrile, α-(trifluoromethylsulfonyloxyimino) cyclohexyl acetonitrile, α-(ethylsulfonyloxyimino)ethyl acetonitrile, α-(propylsulfonyloxyimino)propyl acetonitrile, α-(cyclohexylsulfonyloxyimino)cyclopentyl acetonitrile, α-(cyclohexylsulfonyloxyimino)cyclohexyl acetonitrile, α-(cyclohexylsulfonyloxyimino)-1-cyclopentenyl acetonitrile, α-(ethylsulfonyloxyimino)-1-cyclopentenyl acetonitrile, α-(isopropylsulfonyloxyimino)-1-cyclopentenyl acetonitrile, α-(n-butylsulfonyloxyimino)-1-cyclopentenyl acetonitrile, α-(ethylsulfonyloxyimino)-1-cyclohexenyl acetonitrile, α-(isopropylsulfonyloxyimino)-1-cyclohexenyl acetonitrile and α-(n-butylsulfonyloxyimino)-1-cyclohexenyl acetonitrile.

The aromatic group denoted by $R^3$ in the above given general formula (II) means any group which exhibits physical and chemical properties inherent in aromatic compounds exemplified by phenyl, naphthyl, furyl and thienyl groups. These aromatic groups optionally have one or more of substituent groups on the ring structure such as halogen atoms, alkyl groups, alkoxy groups and nitro groups. The alkyl groups as a class of the groups denoted by $R^4$, preferably, have 1 to 4 carbon atoms and can be straightly linear or branched as exemplified by methyl, ethyl, n-propyl, isopropyl, n-butyl, isobutyl, sec-butyl and tert-butyl groups. The halogenoalkyl groups as the other class of the groups denoted by $R^4$ have, preferably, 1 to 4 carbon atoms and are exemplified by chloromethyl, trichloromethyl, trifluoromethyl and 2-bromopropyl groups.

Examples of the oximesulfonate compounds represented by the above given general formula (II) include: α-(methylsulfonyloxyimino)phenyl acetonitrile, α-(methylsulfonyloxyimino)-4-methoxyphenyl acetonitrile, α-(methylsulfonyloxyimino)-4-methylphenyl acetonitrile, α-(trifluoromethylsulfonyloxyimino) phenyl acetonitrile, α-(trifluoromethylsulfonyloxyimino) -4-methoxyphenyl acetonitrile, α-(ethylsulfonyloxyimino)-4-methoxyphenyl acetonitrile, α-(propylsulfonyloxyimino)-4-methylphenyl acetonitrile and α-(methylsulfonyloxyimino)-4-bromophenyl acetonitrile.

The hydrocarbon groups as a class of the groups denoted by $R^5$ in the above given general formula (III) include aromatic groups and non-aromatic hydrocarbon groups. The aromatic group should, preferably, have 6 to 14 carbon atoms as exemplified by phenyl, tolyl, methoxyphenyl, xylyl, biphenyl, naphthyl and anthryl groups as well as heterocyclic groups such as furanyl, pyridyl and quinolyl groups. The non-aromatic hydrocarbon group, which is free from an aromatic ring structure such as benzene, naphthalene, furan, thiophene and pyridine rings, includes aliphatic hydrocarbon groups and alicyclic hydrocarbon groups such as alkyl, alkenyl, cycloalkyl and cycloalkenyl groups. The alkyl groups, which may be straightly linear or branched, preferably, have 1 to 12 carbon atoms as exemplified by methyl, ethyl, propyl, isopropyl, n-butyl, sec-butyl, tert-butyl, n-pentyl, n-octyl and n-dodecyl groups. The alkenyl groups, preferably, have 2 to 12 carbon atoms as exemplified by ethenyl, propenyl, butenyl, butadienyl, hexenyl and octadienyl groups. The cycloalkyl groups, which, preferably, have 4 to 12 carbon atoms, are exemplified by cyclopentyl, cyclohexyl, cyclooctyl and cyclododecyl groups. The cycloalkenyl groups, which, preferably, have 4 to 12 carbon atoms, are exemplified by 1-cyclobutenyl, 1-cyclopentenyl, 1-cyclohexenyl, 1-cycloheptenyl and 1-cyclooctenyl groups.

The hydrocarbon groups having one or more of substituent groups as the other class of the groups denoted by $R^5$ include the aromatic groups and non-aromatic hydrocarbon groups named above having at least one substituent group such as atoms of a halogen element, e.g., fluorine, chlorine and bromine, hydroxyl groups, alkoxy groups and acyl groups, of which halogenated aryl groups and halogenated alkyl groups having 1 to 4 carbon atoms, e.g., chloromethyl, trichloromethyl, trifluoromethyl and 2-bromopropyl groups, are preferred.

The group denoted by A in the above given general formula (III) is a divalent or tervalent, when the subscript n is 2 or 3, respectively, organic group including aliphatic and aromatic hydrocarbon groups.

Examples of the oximesulfonate compound represented by the general formula (III), of which the group denoted by $R^5$ is a non-aromatic hydrocarbon group, include the compounds expressed by the structural formulas given below, in which Me is a methyl group, Et is an ethyl group, Bu is a butyl group, fMe is a trifluoromethyl group, Ch is a cyclohexyl group, pPn is a 1,4-phenylene group and mPn is a 1,3-phenylene group:

Me—SO$_2$—O—N=C(CN)—pPn—C(CN)=N—O—SO$_2$—Me;

Me—SO$_2$—O—N=C(CN)—mPn—C(CN)=N—O—SO$_2$—Me;

Et—SO$_2$—O—N=C(CN)—pPn—C(CN)=N—O—SO$_2$—Et;

Bu—SO$_2$—O—N=C(CN)—mPn—C(CN)=N—O—SO$_2$—Bu;

Bu—SO$_2$—O—N=C(CN)—pPn—C(CN)=N—O—SO$_2$—Bu;

fMe—SO$_2$—O—N=C(CN)—pPn—C(CN)=N—O—SO$_2$—fMe;

fMe—SO$_2$—O—N=C(CN)—mPn—C(CN)=N—O—SO$_2$—fMe; and

Ch—SO$_2$—O—N=C(CN)—pPn—C(CN)=N—O—SO$_2$—Ch.

Further, examples of the oximesulfonate compound represented by the general formula (III), of which the group denoted by $R^5$ is an aromatic hydrocarbon group, include the compounds expressed by the structural formulas given below, in which Me is a methyl group, Ph is a phenyl group, pPn is a 1,4-phenylene group and mPn is a 1,3-phenylene group:

Ph—SO$_2$—O—N=C(CN)—pPn—C(CN)=N—O—SO$_2$—Ph;

Me—pPn—SO$_2$—O—N=C(CN)—pPn—C(CN)=N—O—SO$_2$—pPn—Me;

Me—pPn—SO$_2$—O—N=C(CN)—mPn—C(CN)=N—O—SO$_2$—pPn—Me; and

MeO—pPn—SO$_2$—O—N=C(CN)—mPn—C(CN)=N—O—SO$_2$—pPn—OMe.

The aromatic group denoted by $R^6$ in the above given general formula (IV) is a group having no reactivity with any of the ingredients in the inventive photoresist composition under the conditions for use of the composition. Though not particularly limitative, the group $R^6$ is, preferably, an aromatic group in respect of the sensitivity of the photoresist composition to excimer laser beams, electron beams and X-rays. The aromatic group here implied is a group having physical and chemical properties inherent in aromatic compounds including, for example, phenyl, naphthyl, furyl and thienyl groups, optionally, substituted by inert substituent groups such as halogen atoms, e.g., atoms of chlorine, bromine and iodine, alkyl groups, alkoxy groups and nitro groups.

The aromatic polycyclic hydrocarbon groups as a class of the groups denoted by $R^7$ in the general formula (IV) include aromatic condensed-ring polycyclic hydrocarbon groups such as 2-indenyl, 1-naphthyl, 2-naphthyl and 2-anthryl groups and aromatic non-condensed-ring polycyclic hydrocarbon groups such as biphenyl and terphenyl groups. These hydrocarbon groups can be substituted by a substituent such as an atom of halogen, e.g., chlorine, bromine and iodine, nitro group, amino group, hydroxyl group, alkyl group and alkoxy group as in 5-hydroxy-1-naphthyl group and 4-amino-1-naphthyl group.

The saturated or unsaturated non-aromatic polycyclic hydrocarbon groups as the other class of the groups denoted by $R^7$ include a polycyclic hydrocarbon group such as a polycyclic terpene residue and adamantyl group which can be substituted on the ring by an atom of halogen, e.g., chlorine, bromine and iodine, nitro group, amino group, hydroxyl group, oxo group, alkyl group or alkoxy group. Examples of the groups suitable as $R^7$ include camphor-3-yl, camphor-8-yl, camphor-10-yl and 3-bromocamphor-10-yl groups.

The group denoted by $R^7$ is, preferably, a naphthyl or camphor-10-yl group or, more preferably, 1-naphthyl group in respect of the good pattern resolution.

Examples of the oximesulfonate compounds represented by the general formula (IV) include: α-(1-naphthylsulfonyloxyimino)-4-methoxybenzyl cyanide, α-(2-naphthylsulfonyloxyimino)-4-methoxybenzyl cyanide, α-(1-naphthylsulfonyloxyimino)benzyl cyanide, α-(2-naphthylsulfonyloxyimino)benzyl cyanide, α-(10-camphorsulfonyloxyimino)-4-methoxybenzyl cyanide, α-(10-camphorsulfonyloxyimino)benzyl cyanide, α-(3-camphorsulfonyloxyimino)-4-methoxybenzyl cyanide, and α-(3-bromo-10-camphorsulfonyloxyimino)-4-methoxybenzyl cyanide.

The unsubstituted or substituted, saturated or unsaturated divalent hydrocarbon groups as a class of the groups denoted by $R^8$ in the above given general formula (V) is a straightly linear or branched hydrocarbon group having 1 to 6 carbon atoms optionally substituted by one or more of substituent groups such as halogen atoms, nitro groups, acetylamino groups, lower alkoxy groups and monocyclic aryl groups. Particularly preferable as $R^8$ are those having 2 to 4 carbon atoms such as ethylene, propylene and vinylidene groups as well as derivatives thereof substituted by halogen atoms, lower alkoxy groups or monocyclic aryl groups. The unsubstituted or substituted divalent aromatic groups as the other class of the groups denoted by $R^8$ include monocyclic and bicyclic ones of which particularly preferable are phenylene and naphthylene groups as well as derivatives thereof substituted by halogen atoms, nitro groups or acetylamino groups.

On the other hand, the unsubstituted or substituted, saturated or unsaturated monovalent hydrocarbon groups as a class of the groups denoted by $R^9$ in the above given general formula (V) is a straightly linear or branched hydrocarbon group having 1 to 8 carbon atoms optionally substituted by one or more of substituent groups such as halogen atoms, nitro groups, acetylamino groups, lower alkoxy groups and monocyclic aryl groups, of which particularly preferable are those having halogen atoms and/or lower alkoxy groups as the substituents. The unsubstituted or substituted monovalent aromatic groups as the other class of the groups denoted by $R^9$ include monocyclic and bicyclic ones of which particularly preferable are phenyl groups substituted by halogen atoms, vinyl groups, alkyl groups or alkoxy groups.

Examples of the oximesulfonate compounds represented by the general formula (V) include: N-methylsulfonyloxy succinimide, N-isopropylsulfonyloxy succinimide, N-chloro-ethylsulfonyloxy succinimide, N-(p-methoxyphenyl)sulfonyloxy succinimide, N-(p-vinylphenyl)sulfonyloxy succinimide, N-naphtylsulfonyloxy succinimide, N-phenylsulfonyloxy succinimide, N-(2,4,6-trimethylphenyl)sulfonyloxy succinimide, N-methylsulfonyloxy maleimide, N-isopropylsulfonyloxy maleimide, N-chloroethylsulfonyloxy maleimide, N-(p-methoxyphenyl)sulfonyloxy maleimide, N-(p-vinyl-phenyl)sulfonyloxy maleimide, N-naphtylsulfonyloxy maleimide, N-phenylsulfonyloxy maleimide, N-(2,4,6-trimethylphenyl)sulfonyloxy maleimide, N-methylsulfonyloxy phthalimide, N-isopropylsulfonyloxy phthalimide, N-chloro-ethylsulfonyloxy phthalimide, N-(p-methoxyphenyl) sulfonyloxy phthalimide, N-(p-vinylphenyl)sulfonyloxy phthalimide, N-naphtylsulfonyloxy phthalimide, N-phenylsulfonyloxy phthalimide and N-(2,4,6-trimethylphenyl)sulfonyloxy phthalimide.

The above described various radiation-sensitive acid-generating compounds suitable as the component (C) in the inventive photoresist composition can be used either singly or as a combination of two kinds or more according to need. The amount of the component (C) in the inventive photoresist composition is in the range, usually, from 0.5 to 30 parts by weight per 100 parts by weight of the alkali-soluble polyhydroxystyrene-based resin as the component (A). When the amount thereof is too small, pattern image formation cannot be fully accomplished while, when the amount thereof is too large, a uniform photoresist solution can hardly be obtained. When a photoresist layer of a relatively small thickness of, for example, 0.5 to 1.0 μm is desired, the amount of the component (C) is in the range, preferably, from 0.5 to 10 parts by weight or, more preferably, from 3 to 8 parts by weight and, when the thickness of the desired photoresist layer is relatively large in the range, for example, from 2.0 to 6.0 μm, the amount of the component (C) is in the range, preferably, from 10 to 30 parts by weight or, more preferably, from 15 to 20 parts by weight per 100 parts by weight of the component (A). Thus, the amount of the component (C) should be selected depending on the thickness of the desired photoresist layer, the amount of the component (C) being larger when the thickness of the photoresist layer is larger. This is presumably because, when the thickness of the photoresist layer is large, the volume of the photoresist layer to be photocured is large so that photocuring of the resist layer can be rapidly accomplished only by increasing the amount of the acid-generating agent to enhance the efficiency for the generation of an acid.

The acid-generating agent as the component (C) is desired to be sensitive to the light having a wavelength corresponding to the exposure light still retaining transparency to the light. When the thickness of the desired photoresist layer is relatively large, in particular, transparency of the acid-generating agent is important in order to have the exposure light reaching the bottom of the photoresist layer with high efficiency. In this regard, the acid-generating agent should be selected depending on the wavelength of the exposure light. When the i-line light of 365 nm wavelength is used as the exposure light, for example, the acid-generating agent is selected preferably from the compounds represented by the general formula (II) in which the group denoted by $R^3$ is an aromatic group. Examples of preferable acid-generating compounds of the general formula (II) include a -(methylsulfonyloxy-imino)-1-phenyl acetonitrile having a phenyl group as $R^3$ and a methyl group as $R^4$, α-(methylsulfonyloxyimino)-1-(p-methyl-phenyl) acetonitrile having a p-methylphenyl group as $R^3$ and a methyl group as $R^4$ and α-(methylsulfonyloxyimino)-1-(p-methoxyphyenyl) acetonitrile having a p-methoxyphenyl group as $R^3$ and a methyl group as $R^4$, of which α-(methylsulfonyloxyimino)-1-phenyl acetonitrile is particularly preferable because this compound has high transparency to and excellent acid-generating efficiency with the i-line light. When an excimer laser beam having a wavelength of 248 nm is used as the exposure light, the preferable acid-generating compounds are those represented by the general formula (I) in which the group denoted by $R^1$ is an aliphatic hydrocarbon group and, in particular, $R^1$ is a cyclopentenyl group and $R^2$ is an alkyl group having 1 to 4 carbon atoms as well as those represented by the general formula (IV) of which $R^6$ is a phenyl group and $R^7$ is a naphthyl or camphor-10-yl group. Incidentally, the compounds represented by the general formula (IV) are suitable as an acid-generating agent in a chemical-sensitization photoresist composition used in lithographic patterning using electron beams or X-rays as the actinic rays for exposure.

The component (D) in the inventive photoresist composition is a compound having at least 4 phenolic hydroxyl groups in a molecule and having a molecular weight not exceeding 2000 or, preferably, not exceeding 1000. Examples of such a compound include benzophenone compounds substituted by at least 4 hydroxyl groups. When a benzophenone compound having only 3 or 2 hydroxyl groups in a molecule, i.e. trihydroxy benzophenone or dihydroxy benzophenone, is used as the component (D), the solubility of the resist layer in unexposed areas in an aqueous alkaline developer solution cannot be high enough so that pattern formation by the development treatment is sometimes incomplete to leave an unremoved portion of the resist layer at the bottom thereof with a consequent decrease of pattern resolution along with an upwardly narrowing trapezoidal cross sectional profile of the patterned resist layer.

Examples of the aromatic polyhydroxy compounds suitable as the component (D) in the inventive photoresist composition include, besides various kinds of polyhydroxy benzophenone compounds such as tetrahydroxy benzophenones, pentahydroxy benzophenones, hexahydroxy benzophenones and heptahydroxy benzophenones, hydroxyaryl compounds such as bis[2-hydroxy-3-(2'-hydroxy-5'-methylbenzyl)-5-methylphenyl] methane, bis(4-hydroxy-3,5-dimethylphenyl)-3,4-dihydroxy-phenyl methane, bis(4-hydroxy-2,5-dimethylphenyl)-3,4-dihydroxyphenyl methane, bis(4-hydroxy-3,5-dimethylphenyl)-2,4-dihydroxyphenyl methane, bis(4-hydroxy-2,5-dimethylphenyl)-2,4-dihydroxyphenyl methane, bis(3-cyclohexyl-4-hydroxy-6-methylphenyl)-3,4-dihydroxyhenyl methane, bis(3-cyclohexyl-6-hydroxy-4-methylphenyl)-3,4-dihydroxyphenyl methane and bis(4-hydroxy-2,3,5-trimethylphenyl)-3,4-dihydroxyphenyl methane, bis(hydroxyphenyl) alkane compounds such as 2-(2,3,4-trihydroxyphenyl)-2-(2',3',4'-trihydroxyphenyl) propane and 2-(2,4-dihydroxyphenyl)-2-(2',4'- dihydroxyphenyl) propane, polyhydroxystyrene compounds having a molecular weight not exceeding 2000 such as poly(o-hydroxystyrene), poly(m-hydroxystyrene), poly(p-hydroxystyrene), poly($\alpha$-methyl-p-hydroxystyrene) and poly(4-hydroxy-3-methylstyrene), of which those having the structure of benzophenone are particularly preferable. The above mentioned benzophenone compounds, hydroxyaryl compounds, bis(hydroxyphenyl) alkane compounds and polyhydroxystyrene compounds can optionally be substituted by substituent groups other than hydroxyl. These aromatic polyhydroxy compounds can be used either singly or as a combination of two kinds or more according to need. Particularly preferable among the above named compounds are tetrahydroxy benzophenones, pentahydroxy benzophenones and hexahydroxy benzophenones in respect of the stability in the photosensitivity of the photoresist composition as well as little occurrence of the upwardly narrowing trapezoidal cross sectional profile of the patterned resist layer.

Another criterion for the selection of a compound suitable as the component (D) is that the compound should have as low as possible absorption of the light of which the wavelength is within the wavelength range of the light used in the pattern-wise exposure of the photoresist layer because of the stability of the photosensitivity obtained thereby. In this regard, for example, 2,2',4,4'-tetrahydroxy benzophenone and 2,2',3,4,4'-pentahydroxy benzophenone, having relatively strong absorption of the ultraviolet light having a wavelength in the i-line region (365 nm), should be used in a small amount since otherwise the exposure light is strongly absorbed by the photoresist layer in the patterning exposure of the resist layer to light not to reach the bottom of the resist layer. This problem is not so serious when the thickness of the photoresist layer is small, for example, not to exceed 3.0 $\mu$m but, when the thickness of the photoresist layer is relatively large to be up to 6.0 $\mu$m, the patterned resist layer sometimes has a downwardly narrowing trapezoidal cross sectional profile. Accordingly, the amount of these compound as the component (D) in the inventive photoresist composition is in the range from 0.5 to 5.0 parts by weight per 100 parts by weight of the component (A). On the other hand, 2,3,4,4'-tetrahydroxy benzophenone and 2,3,3',4,4',5-hexahydroxy benzophenone have relatively low absorption of the ultraviolet light in the wavelength range of the i-line light not to cause the above mentioned undesirable phenomenon so that they can be used as the component (D) in an amount in the range from 2.5 to 10.0 parts by weight or, preferably, from 3.0 to 6.0 parts by weight per 100 parts by weight of the component (A).

The above described components (A), (B), (C) and (D) are each an essential ingredient in the inventive photoresist composition in order to avoid the undesirable phenomenon of an upwardly narrowing trapezoidal cross sectional profile of the patterned resist layer. Omission of any one of these four components in the formulation of the photoresist composition results in inferior performance of the photoresist composition.

It is of course optional that the negative-working chemical-sensitization photoresist composition of the present invention is compounded with various kinds of additive agents having compatibility with the essential ingredients and conventionally used in the photoresist compositions of the prior art including auxiliary resins for improvement of the physical properties of the resist layer, plasticizers, stabilizers, coloring agents and surface active agents each in a limited amount. In particular, advantages are obtained for the improvement of the stability of the composition in storage and exposure dose latitude by compounding the photoresist composition with an amine compound and a carboxylic acid in amounts of from 0.01 to 3 parts by weight and from 0.01 to 5 parts by weight, respectively, per 100 parts by weight of the component (A).

The above mentioned amine compound can be a primary, secondary or tertiary amine compound as well as cyclic amine compound exemplified by aliphatic amines such as dimethylamine, trimethylamine, ethylamine, diethylamine, triethylamine, n-propylamine, di-n-propylamine, tri-n-propylamine, isopropylamine, tributylamine, tripentylamine and aromatic amines such as benzylamine, aniline, N-methylaniline and N,N-dimethylaniline, o-, m- and p-methylanilines, N,N-diethylaniline, diphenylamine and di-p-tolylamine and heterocyclic amines such as pyridine, 2-methylpyridine, 2-ethylpyridine, 2,3-dimethylpyridine, 4-ethyl-2-methylpyridine and 3-ethyl-4-methylpyridine, of which aliphatic amines or, in particular, triethylamine, tributylamine, tripropylamine and tripentylamine are preferred.

On the other hand, the above mentioned carboxylic acid is selected from unsubstituted or substituted aliphatic and aromatic carboxylic acids exemplified by monobasic and polybasic saturated aliphatic carboxylic acids such as formic acid, acetic acid, propionic acid, butyric acid, isobutyric acid, oxalic acid, malonic acid, succinic acid, glutaric acid and adipic acid, unsaturated aliphatic carboxylic acids such as acrylic acid, crotonic acid, isocrotonic acid, 3-butenoic acid, methacrylic acid, 4-pentenoic acid, propiolic acid, 2-butynoic acid, maleic acid and fumaric acid, alicyclic carboxylic acids such as 1,1-cyclohexane dicarboxylic acid, 1,2-cyclohexane dicarboxylic acid, 1,3-cyclohexane dicarboxylic acid, 1,4-cyclohexane dicarboxylic acid and 1,1-cyclohexane diacetic acid, oxycarboxylic acids such as hydroxyacetic acid, alkoxy carboxylic acids such as methoxyacetic acid and ethoxyacetic acid, ketocarboxylic acid such as pyruvic acid, and aromatic carboxylic acids having a hydroxyl, nitro or vinyl group as the substituent such as p-hydroxybenzoic acid, salicylic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinylbenzoic acid and 4-vinylbenzoic acid, aromatic dicarboxylic acid such as phthalic acid, terephthalic acid and isophthalic acid. Among the above named carboxylic acids, aromatic carboxylic acids or, in particular, salicylic acid and 2-nitrobenzoic acid, are preferred.

It is usual that the negative-working chemical-sensitization photoresist composition of the present invention is used in the form of a uniform solution prepared by dissolving the above described essential and optional ingredients in a suitable organic solvent. Examples of suitable organic solvents include ketone solvents such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ether solvents such as dioxane, ester solvents such as methyl lactate, ethyl lactate, methyl acetate, ethyl acetate, butyl acetate, methyl pyruvate, ethyl pyruvate, methyl methoxypropionate and ethyl ethoxypropionate, and amide solvents such as N,N-dimethyl-formamide, N,N-dimethylacetamide and N-methyl-2-pyrrolidone. These organic solvents can be used either singly or as a mixture of two kinds or more according to need.

The procedure for using the inventive photoresist composition in the photolithographic patterning is not particularly different from conventional procedures. Namely, a substrate such as a semiconductor silicon wafer and a glass plate is uniformly coated with the inventive photoresist composition in the form of a uniform solution by using a conventional coating machine such as spinners followed by drying to form a photoresist layer having a thickness of, for example, 0.5 to 6.0 μm, which is pattern-wise exposed to actinic rays such as ultraviolet light, deep ultraviolet light and excimer laser beams through a pattern-bearing photomask, for example, on a minifying projection exposure machine or irradiated with electron beams and X-rays under pattern-wise scanning followed by a post-exposure baking treatment to form a latent image of the pattern in the photoresist layer. Thereafter, the latent image in the resist layer is developed by a development treatment with an aqueous alkaline developer solution such as a 1 to 10% by weight aqueous solution of tetramethyl-ammonium hydroxide so that the resist layer in the unexposed areas is selectively dissolved away leaving a patterned resist layer, which is a high-fidelity reproduction of the photomask pattern, having an orthogonal cross sectional profile without upward narrowing.

By virtue of the unique formulation comprising the above described components (A) to (D), the negative-working chemical-sensitization photoresist composition of the present invention can be used quite satisfactorily to exhibit high photosensitivity, pattern resolution and heat resistance of the patterned resist layer in photolithographic patterning works by using, as the patterning actinic rays, ultraviolet light of a wavelength range of 200 to 400 nm or, in particular, KrF excimer laser beams of 248 nm wavelength or i-line light of 365 nm wavelength. In addition, the inventive photoresist composition is advantageous in respect of the orthogonal cross sectional profile of the patterned resist layer while conventional negative-working photoresist compositions give a more or less upwardly narrowing trapezoidal cross sectional profile of the patterned resist layer.

In the following, the negative-working chemical-sensitization photoresist composition of the present invention is described in more detail by way of Examples, which, however, never limit the scope of the invention in any way. In the following description, the term of "parts" always refers to "parts by weight".

EXAMPLE 1

A negative-working chemical-sensitization photoresist composition in the form of a solution was prepared by dissolving, in 247 parts of propyleneglycol monomethyl ether acetate, 50 parts of a poly(p-hydroxystyrene) resin having a weight-average molecular weight Mw of 2500, 50 parts of a copolymer of p-hydroxystyrene and styrene in a molar proportion of 85:15 having a weight-average molecular weight Mw of 2500 and 15 parts of a melamine resin (Nicalac MW-100M, a product by Sanwa Chemical Co.) with further admixture of 15 parts of α-(methylsulfonyloxyimino)-1-phenyl acetonitrile as a radiation-sensitive acid-generating agent and 3.0 parts of 2,3,3',4,4',5'-hexahydroxy benzophenone.

In the next place, a semiconductor silicon wafer was uniformly coated with the thus prepared photoresist solution on a spinner followed by drying on a hot plate at 110° C. for 90 seconds to give a photoresist layer having a thickness of 3.0 μm. The photoresist layer was then pattern-wise exposed to i-line light through a pattern-bearing photomask on a minifying projection exposure machine (Model NSR-2005i10D, manufactured by Nikon Co.) followed by a post-exposure baking treatment at 110° C. for 90 seconds and subjected to a development treatment with a 2.38% by weight aqueous solution of tetramethylammonium hydroxide for 65 seconds and rinse with water for 30 seconds followed by drying to give a patterned resist layer on the substrate surface. The photosensitivity in this photolithographic patterning was 280 ms and pattern resolution was 0.6 μm.

The above mentioned photosensitivity was represented by the length of the minimum exposure time by which, when the pattern-wise light exposure was undertaken through a photomask for a line-and-space pattern of 1.0 μm width of each line and each space, a line-and-space pattern having a line width to space width ratio of 1:1 could be reproduced. Further, the pattern resolution was expressed by the critical resolution at an exposure dose by which a line-and-space photomask pattern of 1.0 μm line width could be reproduced.

In the next place, a scanning electron microscopic photograph was taken to examine the cross sectional profile of the line-patterned resist layer of 1.0 pm width obtained in the above described manner to find an orthogonal cross sectional profile standing upright on the substrate surface. The undesirable phenomena of upward narrowing and appearance of wavy side lines of the cross sectional profile were not found.

As a measure of the heat resistance, the line-and-space patterned resist layer of 1.0 μm line width was heated at varied temperatures to determine the lowest heating temperature at which collapsing of the shoulder portions of the cross sectional profile took place but collapsing of the shoulder portions of the cross sectional profile could not be detected up to a heating temperature of 300° C.

EXAMPLE 2

A negative-working chemical-sensitization photoresist composition was prepared in the same formulation as in Example 1 excepting for replacement of 3.0 parts of 2,3,3',4,4',5-hexahydroxy benzophenone with 1.5 parts of 2,2',3,4,4'-pentahydroxy benzophenone.

The results of the evaluation tests undertaken in the same manner as in Example 1 were that the photosensitivity was 280 ms and pattern resolution was 0.6 μm. The line-patterned resist layer of 1.0 μm line width had an excellently orthogonal cross sectional profile standing upright on the substrate surface without occurrence of upward narrowing and wavy side lines as examined on a scanning electron microscopic photograph.

EXAMPLE 3

A negative-working chemical-sensitization photoresist composition was prepared in the same formulation as in Example 1 excepting for replacement of 2,3,3',4,4',5-hexahydroxy benzophenone with the same amount of 2,3,4,4'-tetrahydroxy benzophenone.

The results of the evaluation tests undertaken in the same manner as in Example 1 were that the photosensitivity was 280 ms and pattern resolution was 0.6 μm. The line-patterned resist layer of 1.0 μm line width had an excellently orthogonal cross sectional profile standing upright on the substrate surface without occurrence of upward narrowing and wavy side lines as examined on a scanning electron microscopic photograph.

EXAMPLE 4

A negative-working chemical-sensitization photoresist composition was prepared in the same formulation as in Example 1 excepting for replacement of 15 parts of α-(methylsulfonyloxyimino)-1-phenyl acetonitrile with a combination of 15 parts of α-(methylsulfonyloxyimino)-1-(p-methylphenyl) acetonitrile and 5 parts of a -(methylsulfonyloxyimino)-1-(p-methoxyphenyl) acetonitrile and increase of the amount of propyleneglycol monomethyl ether acetate from 247 parts to 414 parts.

The results of the evaluation tests undertaken in the same manner as in Example 1 except that the thickness of the photoresist layer was 1.2 μm instead of 3.0 μm were that the photosensitivity was 90 ms and pattern resolution was 0.4 μm. The line-patterned resist layer of 1.0 μm line width had an excellently orthogonal cross sectional profile standing upright on the substrate surface without occurrence of upward narrowing and wavy side lines as examined on a scanning electron microscopic photograph.

EXAMPLE 5

A negative-working chemical-sensitization photoresist composition in the form of a solution was prepared by dissolving, in 617 parts of propyleneglycol monomethyl ether acetate, 100 parts of a copolymer of p-hydroxystyrene and styrene in a molar proportion of 85:15 having a weight-average molecular weight Mw of 2500 and 15 parts of a melamine resin (Nicalac MW-30, a product by Sanwa Chemical Co.) with further admixture of 3.5 parts of α-(methylsulfonyloxyimino)-1-phenyl acetonitrile as a radiation-sensitive acid-generating agent, 2.0 parts of 2,2',4,4'-tetrahydroxy benzophenone, 0.5 part of tripentylamine and 0.5 part of salicylic acid.

In the next place, a semiconductor silicon wafer was uniformly coated with the thus prepared photoresist solution on a spinner followed by drying on a hot plate at 100° C. for 90 seconds to give a photoresist layer having a thickness of 0.8 μm. The photoresist layer was then pattern-wise exposed to i-line light through a pattern-bearing photomask on a minifying projection exposure machine (Model NSR-2005i10D, manufactured by Nikon Co.) followed by a post-exposure baking treatment at 120° C. for 90 seconds and subjected to a development treatment with a 2.38% by weight aqueous solution of tetramethylammonium hydroxide for 65 seconds and rinse with water for 30 seconds followed by drying to give a patterned resist layer on the substrate surface.

The results of the evaluation tests were that the photosensitivity was 200 ms and pattern resolution was 0.32 μm.

The above mentioned photosensitivity was represented by the length of the minimum exposure time by which, when the pattern-wise light exposure was undertaken through a photomask for a line-and-space pattern of 0.5 μm width of each line and each space, a line-and-space pattern having a line width to space width ratio of 1:1 could be obtained. Further, the pattern resolution was expressed by the critical resolution at an exposure dose by which a line-and-space photomask pattern of 0.5 μm line width could be reproduced.

The line-patterned resist layer of 0.5 μm line width had an excellently orthogonal cross sectional profile standing upright on the substrate surface without occurrence of upward narrowing and wavy side lines as examined on a scanning electron microscopic photograph.

Comparative Example 1

A negative-working chemical-sensitization photoresist composition was prepared in the same formulation as in Example 1 excepting for replacement of 100 parts as a total of the two hydroxystyrene-based polymers with 100 parts of a novolak resin having a weight-average molecular weight Mw of 4000 which was a polycondensation product of a 40:60 mixture of m- and p-cresols with formaldehyde.

The results of the evaluation tests undertaken in the same manner as in Example 1 were that the photosensitivity was 180 ms and pattern resolution was 0.8 μm. The line-patterned resist layer of 1.0 μm line width had an excellently orthogonal cross sectional profile standing upright on the substrate surface without occurrence of upward narrowing and wavy side lines as examined on a scanning electron microscopic photograph. A heat resistance test was undertaken in the same manner as in Example 1 for a line-and-space patterned resist layer of 1.0 μm line width to find that collapsing of the cross sectional profile took place by heating at 140° C.

Comparative Example 2

A negative-working chemical-sensitization photoresist composition was prepared in the same formulation as in Example 1 excepting for replacement of the α-(methylsulfonyloxyimino)-1-phenyl acetonitrile with the same amount of 2-(2-methoxyethenyl)-4,6-bis(trichloromethyl)-1,3,5-triazine.

The results of the evaluation tests undertaken in the same manner as in Example 1 were that the photosensitivity was 90 ms and pattern resolution was 0.7 μm. The line-patterned resist layer of 1.0 μm line width had a noticeably trapezoidal cross sectional profile with occurrence of upward narrowing and wavy side lines as examined on a scanning electron microscopic photograph.

Comparative Example 3

A negative-working chemical-sensitization photoresist composition was prepared in the same formulation as in Example 1 excepting for replacement of the 2,3,3',4,4',5'-hexahydroxy benzophenone with the same amount of 2,4,,5-trihydroxy benzophenone.

The results of the evaluation tests undertaken in the same manner as in Example 1 were that the photosensitivity was 400 ms and pattern resolution was 0.7 μm. The line-patterned resist layer of 1.0 μm line width had a downwardly narrowing trapezoidal cross sectional profile though without occurrence of wavy side lines as examined on a scanning electron microscopic photograph.

Comparative Example 4

A negative-working chemical-sensitization photoresist composition was prepared in the same formulation as in Example 1 excepting for omission of the 2,3,3',4,4',5'-hexahydroxy benzophenone.

The results of the evaluation tests undertaken in the same manner as in Example 1 were that the photosensitivity was 150 ms and pattern resolution was 0.65 μm. The line-patterned resist layer of 1.0 μm line width had an upwardly narrowing trapezoidal cross sectional profile standing upright on the substrate surface though without occurrence of wavy side lines as examined on a scanning electron microscopic photograph.

EXAMPLE 6

A negative-working chemical-sensitization photoresist composition in the form of a solution was prepared by dissolving, in 585 parts of propyleneglycol monomethyl ether acetate, 100 parts of a copolymer of p-hydroxystyrene and styrene in a molar proportion of 85:15 having a weight-average molecular weight Mw of 2500 and 10 parts of a melamine resin (Nicalac MW-30, a product by Sanwa Chemical Co.) with further admixture of 5 parts of N-(p-vinyl-phenyl)sulfonyloxy maleimide as a radiation-sensitive acid-generating agent and 2 parts of 2,2',4,4'-tetrahydroxy benzophenone.

In the next place, a semiconductor silicon wafer was uniformly coated with the thus prepared photoresist solution on a spinner followed by drying on a hot plate at 100° C. for 90 seconds to give a photoresist layer having a thickness of 0.73 μm. The photoresist layer was then pattern-wise exposed to excimer laser beams through a pattern-bearing photomask on a minifying projection exposure machine (Model NSR-2005EX8A, manufactured by Nikon Co.) followed by a post-exposure baking treatment at 120° C. for 90 seconds and subjected to a development treatment with a 2.38% by weight aqueous solution of tetramethylammonium hydroxide for 65 seconds and rinse with water for 30 seconds followed by drying to give a patterned resist layer on the substrate surface.

The results of the evaluation tests were that the photosensitivity was 98 mJ/cm² and pattern resolution was 0.25 μm. The photosensitivity given here was the minimum exposure dose by which a line-and-space pattern of 0.35 μm line width could be reproduced in a 1:1 line to space ratio. The pattern resolution given here was the critical resolution at an exposure dose by which a 0.35 μm photomask pattern could be reproduced.

The line-patterned resist layer of 0.35 μm line width had an orthogonal cross sectional profile standing upright on the substrate surface without occurrence of upward narrowing though with appearance of slightly wavy side lines as examined on a scanning electron microscopic photograph.

EXAMPLE 7

A negative-working chemical-sensitization photoresist composition was prepared in the same formulation as in Example 6 excepting for replacement of 5 parts of N-(p-vinylphenyl)sulfonyloxy maleimide with a combination of 4 parts of α-(1-naphthylsulfonyloxyimino)-4-methoxyphenyl acetonitrile and 2 parts of α-(methylsulfonyloxyimino)-1-phenyl acetonitrile.

The results of the evaluation tests undertaken in the same manner as in Example 6 were that the photosensitivity was 38 mJ/cm² and pattern resolution was 0.23 μm. The line-patterned resist layer of 0.35 μm line width had an orthogonal cross sectional profile standing upright on the substrate surface without occurrence of upward narrowing though with appearance of slightly wavy side lines as examined on a scanning electron microscopic photograph.

What is claimed is:

1. A negative-working chemical-sensitization photoresist composition which comprises, as a uniform solution in an organic solvent:
    (A) 100 parts by weight of an alkali-soluble resin which is a polyhydroxystyrene-based resin having a weight-average molecular weight of at least 2000;
    (B) from 3 to 70 parts by weight of an acid-crosslinkable compound;
    (C) from 0.5 to 30 parts by weight of a radiation-sensitive acid-generating compound selected from the group consisting of
        (C1) the oximesulfonate compounds represented by the general formula $$R^1\text{—C(CN)}=\text{N—O—SO}_2\text{—}R^2,$$

in which $R^1$ and $R^2$ are each a non-aromatic group,
    (C2) the oximesulfonate compounds represented by the general formula $$R^3\text{—C(CN)}=\text{N—O—SO}_2\text{—}R^4,$$

in which $R^3$ is an aromatic group and $R^4$ is a halogen-substituted or unsubstituted alkyl group having 1 to 4 carbon atoms,
    (C3) the oximesulfonate compounds represented by the general formula $$A[\text{—C(CN)}=\text{N—O—SO}_2\text{—}R^5]_n,$$

in which the subscript n is 2 or 3, A is a divalent, when n is 2, or tervalent, when n is 3, organic group and each $R^5$ is an unsubstituted or substituted monovalent hydrocarbon group,
    (C4) the oximesulfonate compounds represented by the general formula $$R^6\text{—C(CN)}=\text{N—O—SO}_2\text{—}R^7,$$

in which $R^6$ is an aromatic group and $R^7$ is a monovalent group selected from the group consisting of aromatic polycyclic hydrocarbon groups and saturated or unsaturated non-aromatic polycyclic hydrocarbon groups, and
    or (C5) the oximesulfonate compounds represented by the general formula

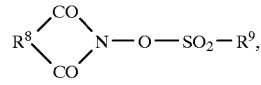

in which $R^8$ is an unsubstituted or substituted divalent saturated hydrocarbon group, unsaturated hydrocarbon group or aromatic group and $R^9$ is an unsubstituted or substituted monovalent saturated hydrocarbon group, unsaturated hydrocarbon group or aromatic group; and
    (D) from 0.5 to 10 parts by weight of a benzophenone compound having at least four hydroxyl groups in a molecule and a molecular weight smaller than 2000.

2. The negative-working chemical-sensitization photoresist composition as claimed in claim 1 in which the polyhydroxystyrene-based resin as the component (A) is a homopolymer of a hydroxystyrene or a copolymer of a hydroxystyrene with a comonomer selected from the group consisting of styrene compounds other than hydroxystyrene, (meth)acrylic acid and esters thereof, maleic anhydride and vinyl acetate.

3. The negative-working chemical-sensitization photoresist composition as claimed in claim 1 in which the alkali-soluble resin as the component (A) is a combination of a homopolymer of a hydroxystyrene and a copolymer of a hydroxystyrene with a styrene compound other than hydroxystyrene wherein the homopolymer to copolymer is in a weight proportion in the range from 30:70 to 70:30.

4. The negative-working chemical-sensitization photoresist composition as claimed in claim 1 in which the alkali-soluble resin as the component (A) has a weight-average molecular weight in the range from 2000 to 20000.

5. The negative-working chemical-sensitization photoresist composition as claimed in claim 1 in which the acid-crosslinkable compound as the component (B) is an amino resin having hydroxyl groups, alkoxyalkyl groups or a combination thereof in the molecule.

6. The negative-working chemical-sensitization photoresist composition as claimed in claim 1 in which the radiation-sensitive acid-generating compound as the component (C) is: (C1) the oximesulfonate compounds represented by the general formula $$R^1-C(CN)=N-O-SO_2-R^2,$$

in which $R^1$ and $R^2$ are each a non-aromatic group.

7. The negative-working chemical-sensitization photoresist composition as claimed in claim 1 in which the radiation-sensitive acid-generating compound as the component (C) is: (C2) the oximesulfonate compounds represented by the general formula $$R^3-C(CN)=N-O-SO_2-R^4,$$

in which $R^3$ is an aromatic group and $R^4$ is a halogen-substituted or unsubstituted alkyl group having 1 to 4 carbon atoms.

8. The negative-working chemical-sensitization photoresist composition as claimed in claim 1 in which the radiation-sensitive acid-generating compound as the component (C) is: (C3) the oximesulfonate compounds represented by the general formula $$A[-C(CN)=N-O-SO_2-R^5]_n,$$

in which the subscript n is 2 or 3, A is a divalent, when n is 2, or tervalent, when n is 3, organic group and each $R^5$ is an unsubstituted or substituted monovalent hydrocarbon group.

9. The negative-working chemical-sensitization photoresist composition as claimed in claim 1 in which the radiation-sensitive acid-generating compound as the component (C) is: (C4) the oximesulfonate compounds represented by the general formula $$R^6-C(CN)=N-O-SO_2-R^7,$$

in which $R^6$ is an aromatic group and $R^7$ is a monovalent group selected from the group consisting of aromatic polycyclic hydrocarbon groups and saturated or unsaturated non-aromatic polycyclic hydrocarbon groups.

10. The negative-working chemical-sensitization photoresist composition as claimed in claim 1 in which the radiation-sensitive acid-generating compound as the component (C) is: (C5) the oximesulfonate compounds represented by the general formula $$R^8\underset{CO}{\overset{CO}{\diagup\hspace{-6pt}\diagdown}}N-O-SO_2-R^9,$$

in which $R^8$ is an unsubstituted or substituted divalent saturated hydrocarbon group, unsaturated hydrocarbon group or aromatic group and $R^9$ is an unsubstituted or substituted monovalent saturated hydrocarbon group, unsaturated hydrocarbon group or aromatic group.

* * * * *

UNITED STATES PATENT AND TRADEMARK OFFICE
CERTIFICATE OF CORRECTION

PATENT NO. : 5,928,837
DATED : July 27, 1999
INVENTOR(S) : Mitsuru SATO et al.

It is certified that error appears in the above-identified patent and that said Letters Patent is hereby corrected as shown below:

Column 18, line 26, "or" should be deleted;
        line 47, "hydroxystyrene" should read --hydroxystyrenes--; and
        line 55, "hydroxystyrene" should read --hydroxystyrenes--.

Signed and Sealed this

Twenty-second Day of February, 2000

Attest:

Q. TODD DICKINSON

Attesting Officer

Commissioner of Patents and Trademarks